(12) United States Patent
Schaffer et al.

(10) Patent No.: US 7,085,080 B2
(45) Date of Patent: Aug. 1, 2006

(54) LOW-DEFORMATION SUPPORT DEVICE OF AN OPTICAL ELEMENT

(75) Inventors: Dirk Schaffer, Jena (DE); Andreas Wurmbrand, Aalen-Reichenbach (DE); Thomas Schletterer, Ossmannstedt (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/004,692

(22) Filed: Dec. 3, 2004

(65) Prior Publication Data

US 2005/0128607 A1    Jun. 16, 2005

(30) Foreign Application Priority Data

Dec. 6, 2003    (DE)    ................. 103 57 113

(51) Int. Cl.
*G02B 7/02*    (2006.01)

(52) U.S. Cl. .................... 359/819; 359/820

(58) Field of Classification Search ............ 359/819, 359/820
See application file for complete search history.

(56) References Cited

U.S. PATENT DOCUMENTS

| | | | |
|---|---|---|---|
| 5,428,482 A | 6/1995 | Bruning et al. |
| 6,445,515 B1 | 9/2002 | Moennig |
| 6,466,380 B1 | 10/2002 | Bischoff |
| 6,538,829 B1 | 3/2003 | Rau et al. |
| 6,552,862 B1 | 4/2003 | Dieker |
| 6,580,570 B1 | 6/2003 | Becker et al. |
| 6,594,093 B1 | 7/2003 | Moeller et al. |
| 6,603,615 B1 | 8/2003 | Melzer et al. |
| 6,667,255 B1 | 12/2003 | Hexels |
| 6,667,839 B1 | 12/2003 | Hartmaier et al. |
| 6,717,742 B1 | 4/2004 | Weber |
| 6,727,984 B1 | 4/2004 | Becht |
| 6,733,369 B1 | 5/2004 | Stacklies et al. |
| 6,768,600 B1 | 7/2004 | Dieker |
| 6,791,768 B1 | 9/2004 | Rau |
| 6,798,588 B1 | 9/2004 | Vogt |
| 6,816,325 B1 | 11/2004 | Becker et al. |
| 6,825,914 B1 | 11/2004 | Schroeder et al. |
| 6,829,107 B1 | 12/2004 | Osterried |
| 6,844,994 B1 | 1/2005 | Melzer et al. |
| 6,859,337 B1 * | 2/2005 | Oshino et al. ............ 359/819 |

FOREIGN PATENT DOCUMENTS

| | | |
|---|---|---|
| EP | 0 230 277 A2 | 7/1987 |
| JP | 2002141270 A | 5/2002 |

* cited by examiner

*Primary Examiner*—Hung Xuan Dang
*Assistant Examiner*—Joseph Martinez
(74) *Attorney, Agent, or Firm*—Wells St. John, P.S.

(57) ABSTRACT

In a low-deformation support device of an optical element (8, 24), in particular an end plate (14) of a projection objective (7) of a projection exposure machine (3) for microlithography for the purpose of producing semiconductor components, in a mount (13), the optical element (8, 14) is connected to the mount (13) at least partly via a bonded connection. The bonded connection is located between the adjacent circumferential walls of mount (13) and optical element (14). The mount (13) is provided with at least three bearing elements (20) which are distributed over the circumference and by means of which the optical element (8, 14) is laterally and axially supported. The mount (13) has spring elements (15) which are constructed monolithically with the bearing elements (20) and are soft in axial and radial directions.

30 Claims, 4 Drawing Sheets

LOW-DEFORMATION SUPPORT DEVICE OF AN OPTICAL ELEMENT

CROSS REFERENCE TO RELATED APPLICATION

This application relates to and claims priority to corresponding German Patent Application No. 103 57 113.2, which was filed on Dec. 06, 2003, and which is incorporated by reference herein.

BACKGROUND OF THE INVENTION

1. Field of the Invention

The invention relates to a low-deformation support device of an optical element, in particular an end plate of a projection objective of a projection exposure machine for microlithography for the purpose of producing semiconductor components, in a mount, the optical element being connected to the mount at least partly via a bonded connection which is located between the adjacent circumferential walls of mount and optical element, and the mount being provided with at least three bearing elements which are distributed over the circumference and by means of which the optical element is laterally and axially supported.

2. Description of the Related Art

A low-deformation support or an optical element is known from U.S. Pat. No. 5,428,482, a mount having a flat outer ring on whose inside diameter three elements are constructed. The geometry of the flexible elements results from a slot which, starting from the centre of the outer ring, is guided into the outer ring and extended in a fashion concentric with the outer ring. This results in flexible elements which merge integrally at one end into the outer ring and can string freely at the other free end. An optical element can be fastened directly by a bonded connection at the three free ends of the flexible elements, the free ends of the flexible elements also being able, however, to merge integrally into an inner ring such that the latter is arranged concentrically inside the outer ring. The optical element is then fastened on this inner ring.

In a further design of such a support, the flexible elements can also be configured such that they merge integrally into the outer ring at both ends, and thereby form a type of leaf spring element. In this case, there is constructed in the middle of the leaf spring a bearing surface pointing towards the centre of the outer ring and on which the optical element is supported. The effect of the flexible elements here is that thermally induced differing expansions or the outer ring and the optical element are compensated. In this way, deformations which act on the outer ring are transmitted only weakly to the optical element.

A substantial disadvantage of the leaf spring in the transmission of deformations is that moments are transmitted due to its being clamped at both ends. For example, moments can be produced by corrugated deformation of the outer ring in the direction of an optical axis of the optical element and thereby be transmitted to the optical element. This effect is stronger the further the two clamping points of the leaf spring are situated apart from one another in the outer ring. Corrugated deformations of the optical element have a particularly disadvantageous effect on the imaging behaviour of high resolution optical systems such as, for example, projection objectives for microlithography.

Also known from EP 0 230 277 E1 is an optical module which has a mount and an optical element. The mount is constructed as a ring on whose inside diameter three radially resilient elements are provided. Each of these radially resilient elements has a bearing surface which is directed towards the centre of the mount. The optical element is fastened on the bearing surfaces via a bonded connection.

It is disadvantageous in this type of low-deformation support of the optical element that the resilient elements are of very stiff construction in an axial direction, and can thereby transmit production-induced corrugations of the mount to the optical element.

JP 202141270 A discloses an optical module which has two retaining rings or retaining elements between which an optical element is introduced or clamped. Or the side directed towards the optical element, the retaining elements each have three bearing surfaces or locating surfaces which form the contact surfaces to the optical element.

It is disadvantageous here that friction effects can occur at the respective contact sites in the event of changes in temperature and of different coefficients of expansion of the retaining rings and the optical elements. Jerky sliding associated therewith can lead to maladjustment of the optical element. Such a solution can therefore not be used for optical systems where stringent requirements must be placed on the positional stabilty of the optical elements.

SUMMARY OF THE INVENTION

It is the object of the present invention to provide a low-deformation support device of an optical element in a mount of the type mentioned at the beginning which eliminates the disadvantages of the prior art, permits the optical element to be supported with low stress, and results in gas tightness between an environment and the optical element.

This object is achieved according to the invention by virtue of the fact that the mount has string elements which are constructed monolithically with the bearing elements and are soft in axial and radial directions.

Thermally induced different expansions of the mount and the optical element that may arise can be very effectively balanced out owing to the inventive configuration of the low-deformation support device of an optical element with the spring elements according to the invention. In this way, no stresses arise in the optical element. Owing to the axial spring action of the spring elements, deformations of the mount are transmitted only minimally to the optical element. Production-inducted corrugations of the mount such as are known from the prior art are no longer transmitted to the optical element by the spring elements according to the invention. Such an inventive device is therefore very well suited to use in projection objectives for microlithography, since the high requirements placed on the positional stability of the optical elements can thereby be met.

Exemplary embodiments of the invention are explained in more detail below with the aid of the drawings, which depict the principles, and in which.

BRIEF DESCRIPTION OF THE DRAWINGS

DETAILED DESCRIPTION

Figure 1:
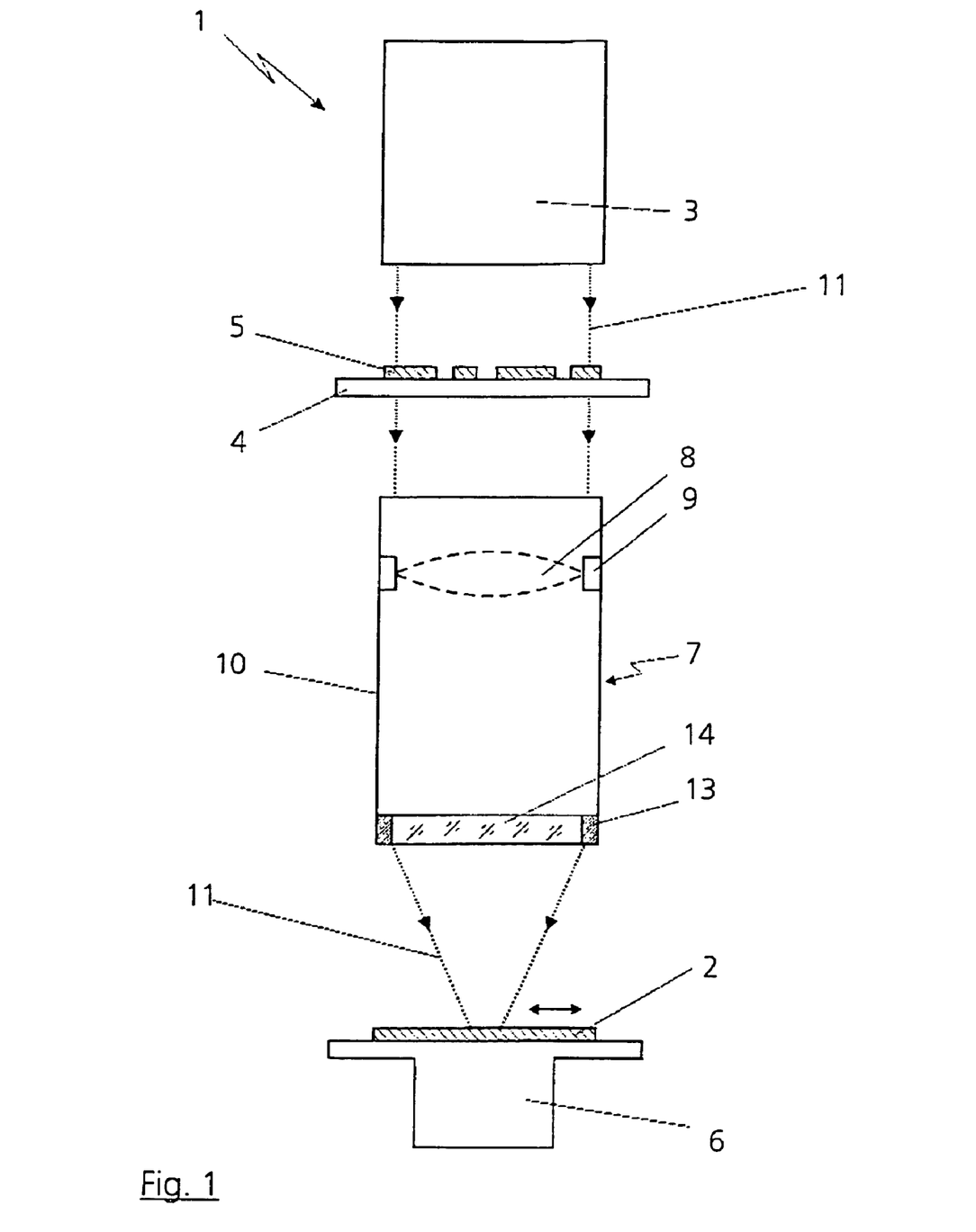
FIG. 1 shows an illustration of the principle of a projection exposure machine for microlithography which can be used to expose structures on wafers coated with photosensitive materials.

FIG. 1 shows a projection exposure machine 1 for microlithography. This machine serves for exposing structures onto a substrate coated with photosensitive materials and which generally consists primarily of silicon and is denoted as wafer 2, in order to produce semiconductor components such as, for example, computer chips.

In essence, the projection exposure machine 1 in this case has an illumination device 3, a device 4 for holding and exactly positioning a mask provided with a grid-like structure, a so-called reticle 5 by which the later structures on the wafer 2 are determined, a device 6 for holding, moving and exactly positioning the wafer 2, and an imaging device, specifically a projection objective 7 having a number of optical elements such as, for example, lenses 8, which are supported in an objective housing 10 of the projection objective 7 via mounts 9.

The basic functional principle provides in this case that the structures inserted into the reticle are exposed onto the wafer 2 with a reduction of the structures.

After exposure has been performed, the wafer 2 is moved further in the direction of the arrow such that a multiplicity of individual fields, each having the structure prescribed by the reticle 5, are exposed onto the same wafer 2. Because of the stepwise progression of the wafer 2 in the projection exposure machine 1, the latter is frequently also denoted as a stepper.

The illuminating device 3 provides projection radiation, for example light or a similar electromagnetic radiation, required for imaging the reticle 5 onto the ware 2, only one projection beam 11 being illustrated here, to show the principle. A laser or the like can be used as a source for this radiation.

The radiation is shaped in the illuminating device 3 via optical elements such that upon striking the reticle 5 the projection radiation has the desired properties with regard to telecentricity, uniform, homogeneous transmission with reference to field polarization and angular polarization, shape of the wavefront, and the like.

The projection beam 11 produces an image of the reticle 5 which, as already explained above, is transmitted onto the wafer 2 by the projection objective 7 in an appropriately reduced fashion. The projection objective 7 has a multiplicity of individual refractive and/or diffractive optical elements such as, for example, lenses, mirrors, prisms and the like. The last optical element in the beam direction is an end plate 14 supported in a mount 13 by means of a device 12 according to the invention.

Figure 2:
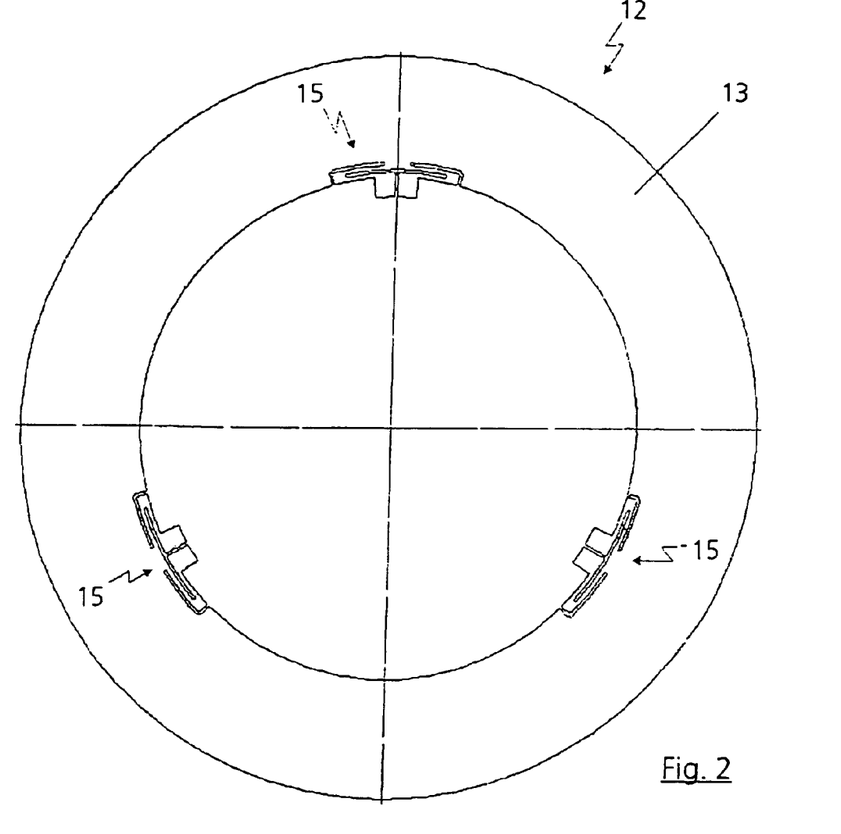
FIG. 2 shows an illustration of the principle of a device according to the invention.

The device 12 is illustrated in principle in FIG. 2 and in a very simplified form. The device 12 has the mount 13 which is constructed in the form of a ring. Here, the mount 13 has spring elements 15 which are arranged in three groups offset at an angle of 120° in each case in a fashion distributed over the circumference of the mount 13 and on which the end plate 14 (not illustrated, but illustrated in more detail in FIG. 4) is supported and fixed. The end plate 14 is supported laterally and axially via the spring elements 15. The spring elements 15 are in each case monolithic with the mount 13.

Figure 3:
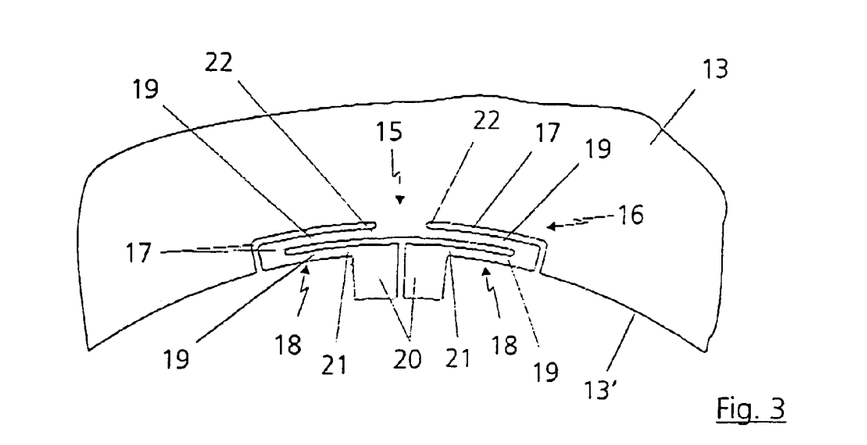
FIG. 3 shows an illustration of the principle of a spring element according to the invention.

A spring element 15 is illustrated in more detail in FIG. 3 in conjunction with the mount 13. The mount 13 merges at an inside diameter 13' of the mount 13 with a web 16 which is configured by slots 17 in such a way that two elements 18 which are resilient in radial and axial directions are configured in the shape of a U with two limbs 19 in each case. The resilient elements 18 are arranged next to one another tangentially to the inside diameter 13' of the mount 13. The result with reference to FIG. 2 is thus six elements 18 which are resilient in radial and axial directions and are arranged in each case next to one another in pairs. In this case, respective ends of the two U-shaped resilient elements 18 arranged next to one another point to one another. The respective two resilient limbs 19 of the U-shaped resilient elements 18 run tangentially to or concentrically with the inside diameter 13' of the mount 13. The respectively inwardly situated limbs 19 (referred to the midpoint of the mount 13) of the U-shaped resilient elements 18 are provided with bearing elements 20 for bearing the end plate 14 at free ends 21 of the limbs 19. The bearing elements 20 are monolithic with the limbs 19. The end plate 14 is fastened on the bearing elements 20 via a bonded connection. At the ends 22 of the limbs 19, which are arranged opposite the limbs 19 connected to the bearing elements 20, the ends 22 of the U-shaped resilient elements 18 merge integrally into the annular mount region 13.

Such a configuration of the spring elements 15 is advantageous to the effect that it is thereby possible for different thermally induced expansions of the mount 13 and of the end plate 14 to be balanced out such that no stresses occur in the end plate 14 itself. Furthermore, the particular advantage of the resilient elements 18 of U-shaped configuration is that only minimum moments are transmitted from the mount 13 onto the end plate 14. Such moments are mostly produced when a mating part is screwed onto the screw-on surface of a flange of the mount 13, which surface is uneven because of production, mostly being corrugated. Because the ends 22 of the limbs 19, which merge integrally into the annular mount region 13, and the ends 20 and 21, respectively, bonded to the end plate 14, of two adjacent U-shaped resilient elements 18 are situated close to one another azimuthally, only minimum moments are transmitted onto the end plate 14.

Figure 4:
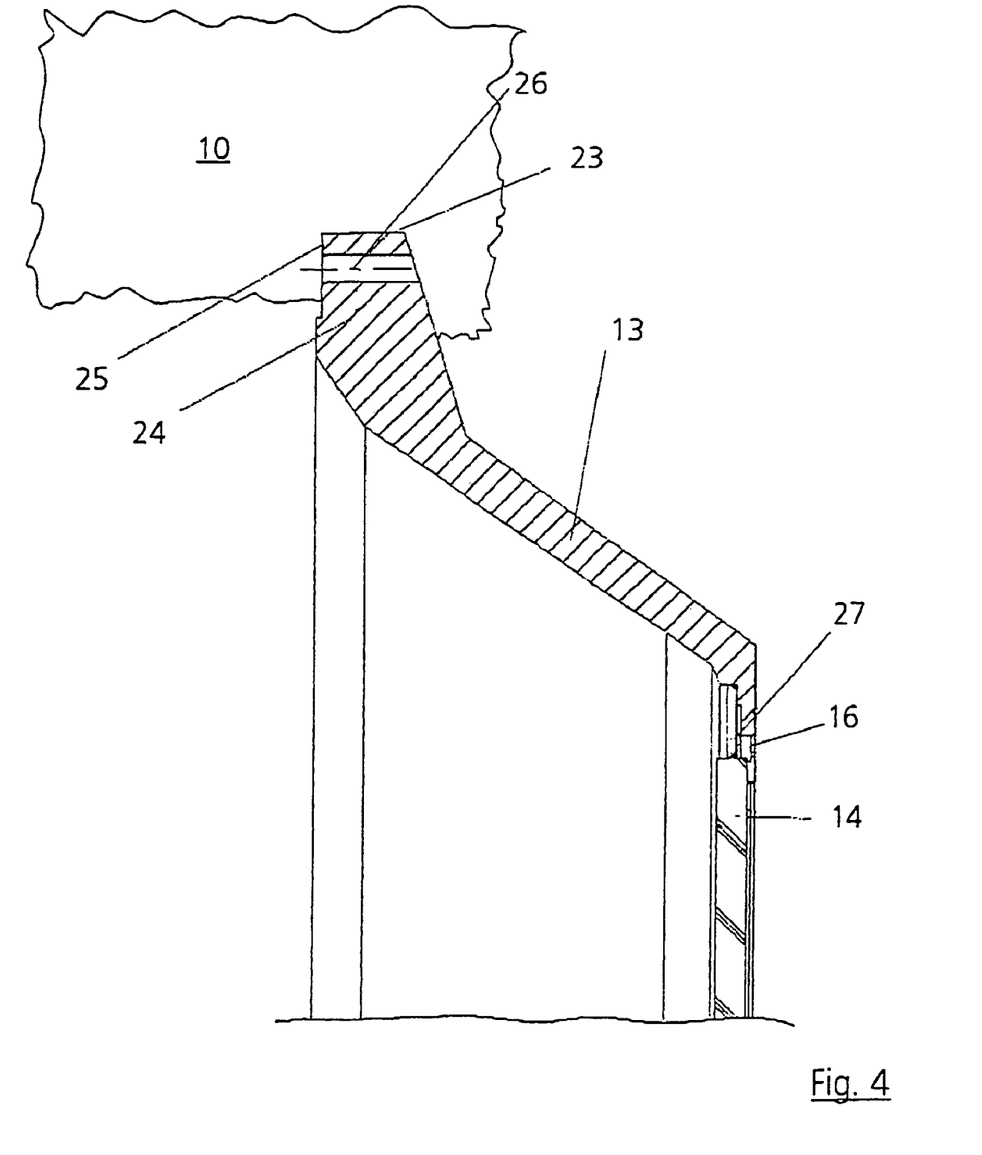
FIG. 4 shows, in a sectional view, the principle of a connection between a mount and an optical element in accordance with the device according to the invention.

A section view of a connection between the mount 13 and the end plate 14 is illustrated in principle in FIG. 4. As already mentioned, the mount 13 is of annular construction and merges into a flange 24 in the direction of an outside diameter 23 of the mount 13. A surface 25 of the flange 24 which is of planar design serves as screw-on surface via which the device 1 bears against the housing 10 of the projection objective 7. The mount 13 or the flange 24 of the mount 13 can be fastened, for example, via a screw which is guided through an axially arranged bore 26 on the flange 24. Of course, other types of fastening can also be used. The fastening of the mount 13 on the objective housing 10 can be done, for example, via three mount support points of such description in order thus to enable the end plate 14 to be exchanged simply and quickly.

Figure 5:
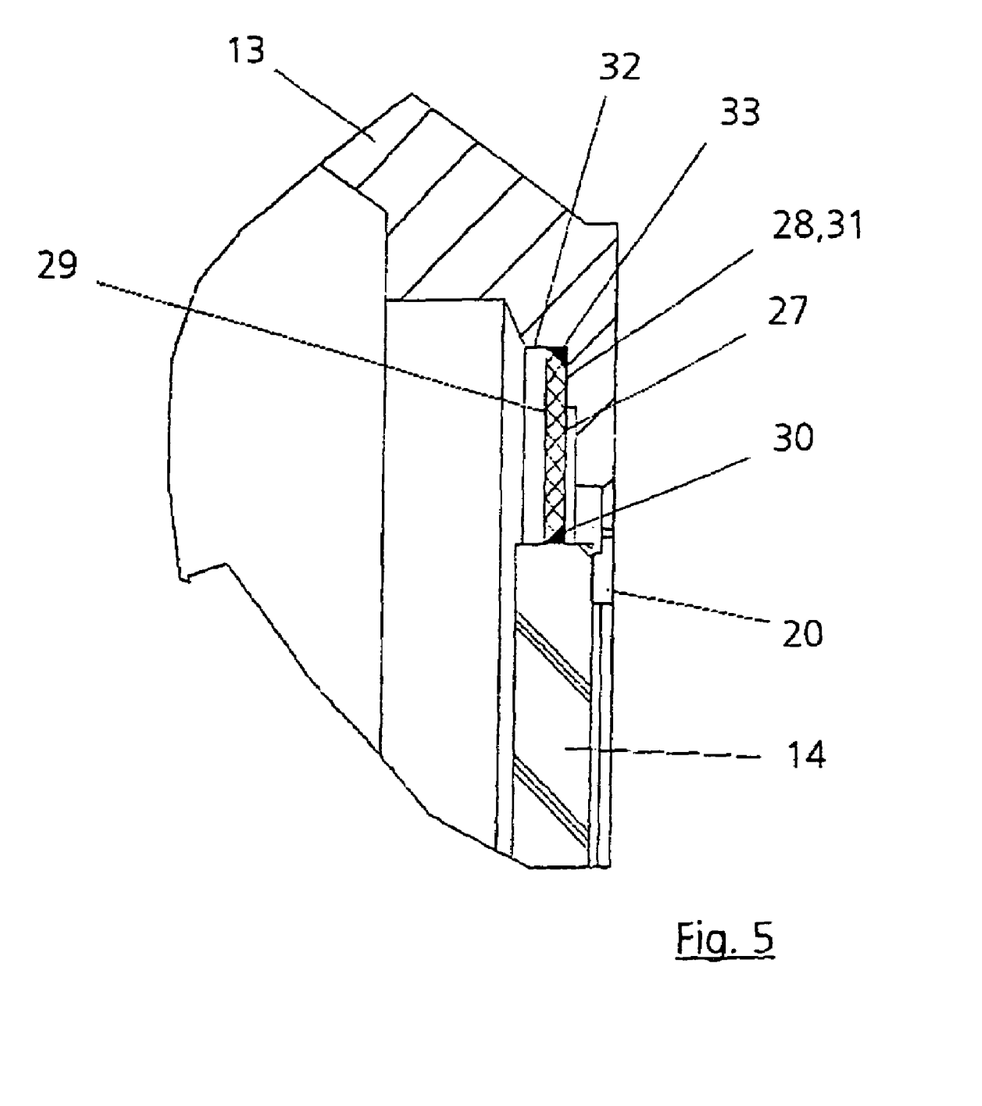
FIG. 5 shows a large illustration of the connection between the mount and the optical element in accordance with FIG. 4.

A sealing diaphragm 27 is provided between the mount 13 and the end plate 14. An enlarged illustration of the connection of the mount 13 to the end plate 14 is illustrated in FIG. 5. The sealing diaphragm 27 is produced from a very thin material, preferably an elastic material, the said diaphragm having the shape of a disc with an inside diameter 28 and an outside diameter 29. The sealing diaphragm 27 is arranged concentrically with the end plate 14 and is located in the direction of an optical axis (not illustrated) exactly in the middle of the end plate 14, specifically on a neutral axis (region or layer which is not expanded and is stressfree). At its inner diameter 28, the sealing diaphragm 27 does not touch the end plate 14, and so a defined wedge-shaped gap 30 is produce between the sealing diaphragm 27 and the end plate 14. The sealing between the end plate 14 and the sealing diaphragm 27 is produced by introducing a bonding agent into a gap 30, thereby producing a bonding seam. The bonding agent applied for this purpose should be highly elastic and ensure adequate tightness. At its outside diameter 29, the sealing diaphragm 27 rests on an annular surface 31 of the mount 13 and is centred with the mount 13 and with the end plate 14 by a locating diameter 32 on the mount. The sealing between the seating diaphragm 27 and the mount 13 is implemented by introducing a bonding agent into a wedge-shaped gap 33 and the bonding seam resulting therefrom.

The end plate 14 can be accommodated compactly in an assembly by means of the device 12 in a fashion held with low stress and sealing. However, the functions of holding and sealing are separated from one another by means of the components. This means that materials can be allocated optimally, for example a stiff bonding agent can be provided for holding and a highly elastic one can be provided for sealing the end plate 14. The most varied materials can be used in this case as bonding materials.

The end plate 14 is therefore very largely decoupled from deformations on the mount 13. Deformations on the mount 13 can merely induce tilting of the end plate 14. However, these can be minimized or eliminated by suitable screw-on and adjusting elements on the flange 24. The very thin sealing membrane 27, which can transmit only minimum forces in the direction of the optical axis of the end plate 14, also transmits only minimum deformations from the flange 24 of the mount 13 to the end plate 14.

The mount 13 can be produced simply and cost-effectively as a turned part for example. The resilient elements 18 can be produced or manufactured in one plane, for example, by means of wire erosion.

In a further exemplary embodiment, it is also possible in this way to mount another optical element instead of an end plate 14, in particular a refractive and/or diffractive element such as, for example, lenses, mirrors, prisms and the like.

What is claimed is:

1. Low-deformation support device of an optical element in a mount, the mount comprising a single structure, the optical element being connected to the mount at least partly via a bonded connection which is located between the adjacent circumferential walls of mount and optical element, and the mount being provided with at least three bearing elements which are distributed over the circumference whereby the optical element is laterally and axially supported on the at least three bearing elements, wherein said mount is provided with spring elements which are constructed monolithically with said bearing elements and are soft in axial and radial directions.

2. Device according to claim 1, wherein in each case one spring element comprises two resilient elements which are arranged tangentially next to one another in said mount.

3. Device according to claim 1, wherein at least one of the spring elements is of approximately U-shaped construction.

4. Device according to claim 3, wherein limbs of the at least one U-shaped resilient element are arranged tangentially to an inside diameter of said mount.

5. Device according to claim 1, wherein said mount is provided with at least three groups of spring elements each having at least two resilient elements and each having at least two bearing elements for the optical element.

6. Device according to claim 5, wherein said groups are arranged at a spacing of in each case 120° in the mount.

7. Device according to claim 1, wherein a sealing diaphragm is provided between said mount and said optical element.

8. Device according to claim 7, wherein said sealing diaphragm is constructed as a disc.

9. Device according to claim 8, wherein a bonded connection is provided between said optical element and said sealing diaphragm for the purpose of sealing.

10. Device according to claim 7, wherein a bonded connection is provided between said sealing diaphragm and said mount for the purpose of sealing.

11. Device according to claim 1, wherein said mount is connected via at least three mount support points to a housing.

12. Device according to claim 1, wherein said optical element is constructed as an end plate.

13. Projection objective for a projection exposure machine in microlithography, comprising an objective housing in which a number of optical elements that are connected to the objective housing via mounts are arranged, at least one optical element, being supported at least approximately with low deformation and exchangeably in a device in accordance with claim 1.

14. Projection objective according to claim 13, wherein the optical element is an end plate.

15. Low-deformation support device of an end plate of a projection objective of a projection exposure machine for microlithography for the purpose of producing semiconductor components in a mount, an optical element being connected to the mount at least partly via a bonded connection which is located between the adjacent circumferential walls of mount and optical element, and the mount being provided with at least three bearing elements which are distributed over the circumference whereby the optical element is laterally and axially supported on the at least three bearing elements, wherein said mount is provided with spring elements which are constructed monolithically with said bearing elements and are soft in axial and radial directions.

16. Device according to claim 15, wherein in each case one spring element comprises two resilient elements which are arranged tangentially next to one another in said mount.

17. Device according to claim 15, wherein at least one of the spring elements is of approximately U-shaped construction.

18. Device according to claim 17, wherein limbs of the at least one U-shaped resilient element are arranged tangentially to an inside diameter of said mount.

19. Device according to claim 15, wherein said mount is provided with at least three groups of spring elements each having at least two resilient elements and each having at least two bearing elements for the optical element.

20. Device according to claim 15, wherein a sealing diaphragm is provided between said mount and said end plate.

21. Device according to claim 20, wherein said sealing diaphragm is constructed as a disc.

22. Device according to claim 21, wherein a bonded connection is provided between said end plate and said sealing diaphragm for the purpose of sealing.

23. Device according to claim 20, wherein a bonded connection is provided between said sealing diaphragm and said mount for the purpose of sealing.

24. Device according to claim 15, wherein said mount is connected via at least three mount support points to a housing of the projection objective.

25. Low-deformation support device of an optical element in a mount, the optical element being connected to the mount at least partly via a bonded connection which is located between the adjacent circumferential walls of mount and optical element, and the mount being provided with at least three bearing elements which are distributed over the circumference whereby the optical element is laterally and axially supported, wherein said mount is provided with spring elements which are constructed monolithically with said bearing elements and are soft in axial and radial directions; and  wherein a sealing diaphragm is provided between said mount and said optical element.

26. Device according to claim 25, wherein said sealing diaphragm is constructed as a disc.

27. Device according to claim 26, wherein a bonded connection is provided between said optical element and said sealing diaphragm for the purpose of sealing.

28. Device according to claim 25, wherein a bonded connection is provided between said sealing diaphragm and said mount for the purpose of sealing.

29. Low-deformation support device of an optical element in a mount, the optical element being connected to the mount at least partly via a bonded connection which is located between the adjacent circumferential walls of mount and optical element, and the mount being provided with at least three bearing elements which are distributed over the circumference whereby the optical element is laterally and axially supported, wherein said mount is provided with spring elements which are constructed monolithically with said bearing elements and are soft in axial and radial directions;

wherein in each case one spring element comprises two resilient elements which are arranged tangentially next to one another in said mount; and  wherein at least one resilient element is of approximately U-shaped construction.

30. Low-deformation support device of an end plate of a projection objective of a projection exposure machine for microlithography for the purpose of producing semiconductor components in a mount, an optical element being connected to the mount at least partly via a bonded connection which is located between the adjacent circumferential walls of mount and optical element, and the mount being provided with at least three bearing elements which are distributed over the circumference whereby the optical element is laterally and axially supported, wherein said mount is provided with spring elements which are constructed monolithically with said bearing elements and are soft in axial and radial directions;

wherein in each case one spring element comprises two resilient elements which are arranged tangentially next to one another in said mount; and  wherein at least one resilient element is of approximately U-shaped construction.

\* \* \* \* \*

UNITED STATES PATENT AND TRADEMARK OFFICE
CERTIFICATE OF CORRECTION

PATENT NO. : 7,085,080 B2
APPLICATION NO. : 11/004692
DATED : August 1, 2006
INVENTOR(S) : Dirk Schaffer et al.

It is certified that error appears in the above-identified patent and that said Letters Patent is hereby corrected as shown below:

Col. 1, line 27 –
  Replace "A low-deformation support or an optical element is"
  With --A low-deformation support of an optical element is--

Col. 1, line 49 –
  Replace "thermally induced differing expansions or the outer ring and"
  With --thermally induced differing expansions of the outer ring and--

Col. 1, line 65 –
  Replace "Also known from EP 0 230 277 E1 is an optical module"
  With -- Also known from EP 0 230 277 B1 is an optical module --

Col. 2, line 12 –
  Replace "optical element is introduced or clamped. Or the side"
  With --optical element is introduced or clamped. On the side--

Col. 2, line 19 –
  Replace "retaining rings and the optical elements. Jerky sliding"
  With --retaining rings and the optical element. Jerky sliding--

Col. 3, line 27 –
  Replace "the structures inserted into the reticle are exposed onto the"
  With --the structures inserted into the reticle 5 are exposed onto the--

Col. 3, line 38 –
  Replace "required for imaging the reticle 5 onto the ware 2, only one"
  With --required for imaging the reticle 5 onto the wafer 2, only one--

UNITED STATES PATENT AND TRADEMARK OFFICE
CERTIFICATE OF CORRECTION

PATENT NO.        : 7,085,080 B2
APPLICATION NO. : 11/004692
DATED             : August 1, 2006
INVENTOR(S)       : Dirk Schaffer et al.

It is certified that error appears in the above-identified patent and that said Letters Patent is hereby corrected as shown below:

Col. 5, line 14 –
  Replace "sealing between the seating diaphragm 27 and the mount 13"
  With --sealing between the sealing diaphragm 27 and the mount 13--

Signed and Sealed this

Twenty-sixth Day of December, 2006

JON W. DUDAS
*Director of the United States Patent and Trademark Office*